US006042390A

United States Patent [19]

Leung

[11] Patent Number: 6,042,390

[45] Date of Patent: Mar. 28, 2000

[54] NETWORK HUB INTERCONNECTION COMPONENT

[75] Inventor: Tommy Y. Leung, San Jose, Calif.

[73] Assignee: Asante Technologies, Inc., San Jose, Calif.

[21] Appl. No.: 08/910,988

[22] Filed: Aug. 14, 1997

Related U.S. Application Data

[60] Continuation-in-part of application No. 08/654,602, May 29, 1996, Pat. No. 5,676,553, which is a division of application No. 08/565,911, Dec. 1, 1995, Pat. No. 5,645,434.

[51] Int. Cl.[7] ................................ H01R 9/09; H05K 1/00

[52] U.S. Cl. ................................ 439/74

[58] Field of Search ..................... 439/74, 633; 361/728, 361/729, 784, 790, 735

[56] References Cited

U.S. PATENT DOCUMENTS

| | | | |
|---|---|---|---|
| 2,911,609 | 11/1959 | Burtt et al. | 439/636 |
| 3,399,372 | 8/1968 | Uberbacher | 439/60 |
| 4,981,438 | 1/1991 | Bekhiet | 437/76.1 |
| 5,051,099 | 9/1991 | Pickles et al. | 439/636 |
| 5,455,742 | 10/1995 | Phoy et al. . | |
| 5,645,434 | 7/1997 | Leung | 439/74 |
| 5,769,668 | 6/1998 | Tondreault | 439/326 |
| 5,800,186 | 9/1998 | Ramirez et al. . | |

*Primary Examiner*—Neil Abrams
*Assistant Examiner*—Hae Moon Hyeon
*Attorney, Agent, or Firm*—Burns Doane Swecker & Mathis LLP

[57] ABSTRACT

A circuit for interconnecting electrical components in a stacked arrangement through the use of connector elements. The connector element can include a connector body having an internal ground plane, and signal lines disposed on the surface at the connector body. The connector element fits into receiving slots located on each of two network hubs.

11 Claims, 2 Drawing Sheets

NETWORK HUB INTERCONNECTION COMPONENT

The patent application is a continuation-in-part of Ser. No. 08/654,602, filed May 29, 1996, now U.S. Pat. No. 5,676,553 which is a divisional of application Ser. No. 08/565,911, filed Dec. 1, 1995, now U.S. Pat. No. 5,645,434.

FIELD OF THE INVENTION

The present invention relates generally to hubs used to interconnect electrical components in a communications network. More particularly, the present invention relates to circuitry for interconnecting a group of hubs in a stacked configuration.

BACKGROUND OF THE INVENTION

In a communications network, large numbers of components such as computers, workstations, or file servers, are electrically connected by a communication network technology such as Ethernet, asynchronous transfer mode (ATM), fiber distributed data interface (FDDI), a technology known as TP-PMD (a copper-wire derivative of FDDI), and a networking technology known as 100VG-AnyLAN, which uses an access method called demand priority access method (DPAM). An Ethernet or other communication network typically includes a hub which is connected to the arrangement of components by communication cables, and which allows the computers, workstations, or file servers to exchange data signals. Data signals sent from a transmitting component to a receiving component are transmitted to the hub and repeated at the hub for transmission to the receiving component. The hub enables multiple computers, workstations, or file servers to share resources in a variety of applications. These applications include client-server database systems, in which a back-end database "engine" handles queries from multiple client front-ends running on desktop personal computers. The volume of data carried over the communication network escalates considerably as new users, new applications software, and more powerful computers or workstations are added to the network. As the volume of data carried over the network increases toward the maximum capacity, the data transfer rate through the hub and communication cables decreases, causing delays in computer applications and severely reducing the effectiveness of the network. Further, as the number of users associated with a network increases, more access ports are needed. To alleviate this problem, it is highly desirable to increase the capacity and/or the speed of the network.

A typical network hub includes one or more devices for routing data transfers between a number of ports (e.g., 12) in a workgroup. Each port may be assigned to one or more individual users or one or more individual computers, workstations, or servers. To increase the number of ports available to a workgroup, multiple hubs may be connected. Hub connections are typically achieved by uplink cables, such as unshielded twisted pair (UTP) cables, shielded twisted pair (STP) cables, or fiber optic cabling. In large, complex networks, a significant number of cables may be required. Cables present significant design limitations. For example, the total length of cable between hub units in a high-speed (e.g., 100 megabits per second) network must be less than 205 meters, and the total length of cable from a hub unit to a computer or other component must be less than 100 meters. Further, cables cause signal delay which can contribute to delays in network applications; thus, longer cables cause increased delay. In addition, signal reflection occurs at cable termination or connection points; thus, an increased number of cables causes increased delay. The reflected signals at the cable termination points contribute to signal degradation and inhibit network performance.

SUMMARY OF THE INVENTION

To overcome the above problems, and provide other advantages, the present invention provides for an arrangement of electrical components, such as communication network hubs connected by connector elements, and a circuit for interconnecting electrical components such as network hubs in a communications network.

The network hubs can be communication network hubs for exchanging communication signals between network devices such as computers, workstations, file servers, or other devices. According to exemplary embodiments, the hubs can include a plurality of substantially identical receiving slots for receiving connector elements to electrically connect two network hubs. The connector elements can include a dielectric connector body which is provided with electrical traces disposed on the connector body for cooperating with electrical contacts disposed in the receiving slots such that the electrical traces are brought into electrical contact with the electrical contacts when a connector element is inserted into a receiving slot. The connector element can also include an aligning means such as a slotted groove on the connector body which cooperates with an aligning element disposed in the receiving slot for ensuring the proper alignment of electrical traces and electrical contacts.

Embodiments are also disclosed for connecting Ethernet switches which accommodate higher frequency signals by printing signal lines and ground lines in an alternating fashion on the outer surfaces of the connector, and which include grounding planes within the connector body.

BRIEF DESCRIPTION OF THE DRAWINGS

A more complete understanding of the present invention will result from reading the following Detailed Description of Preferred Embodiments in conjunction with the attached drawings, in which like reference numerals indicate like elements, and in which.

DETAILED DESCRIPTION OF PREFERRED EMBODIMENTS

Figure 1:
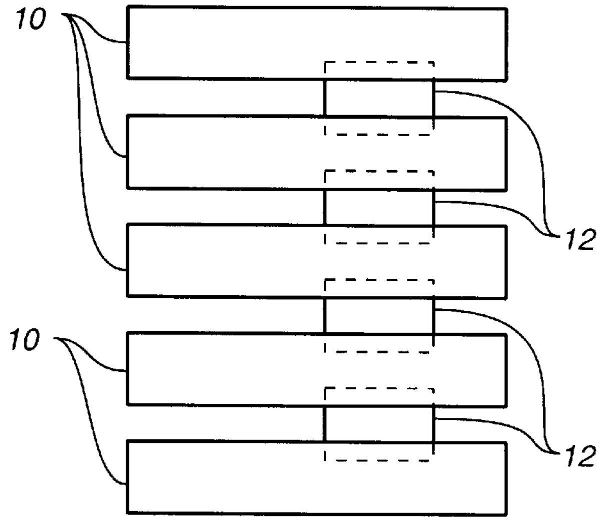
FIG. 1 is a diagram of an arrangement of interconnected network hubs according to an embodiment of the present invention.

Referring now to FIG. 1, an arrangement of interconnected electrical components according to one embodiment of the present invention is shown. The electrical components are in the form of communication network hubs 10 arranged in a stack and connected by connector elements 12 such as those which will be described below with reference to FIG. 2. The hubs 10 are stacked together, and the hubs and connector elements 12 form a substantially continuous signal bus for conducting signals between the hubs 10 and between the network devices (not shown) connected to the hubs 10.

Figure 2A:
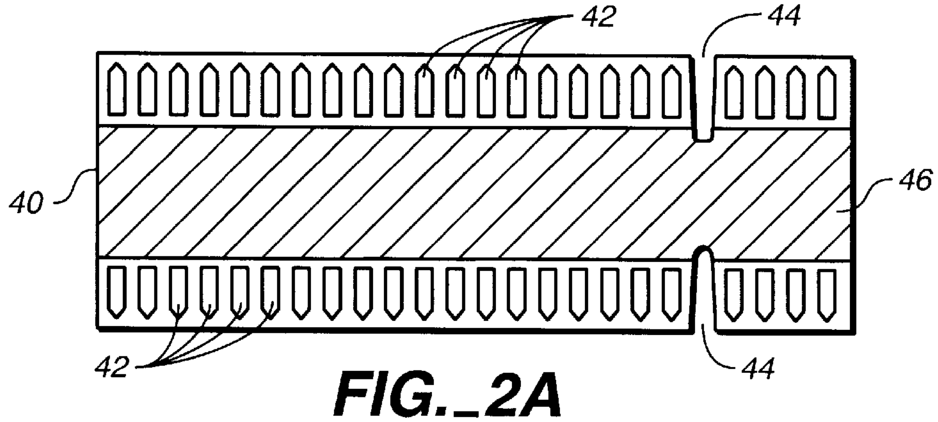
FIGS. 2A–B are diagrams showing a perspective view and a cross-sectional view, respectively, of a connector element according to an embodiment of the present invention.

Referring now to FIG. 2A, a perspective view showing a face of a connector element 40 according to one embodiment of the present invention is shown. The connector element 40 has a substantially rectangular body, and electrical traces 42 are disposed on the connector element 40, such as by printing. The electrical traces 42 include ground traces and signal traces which are brought into electrical contact with ground contacts and signal contacts, respectively, of an electrical component when the connector element 40 is inserted into in the receiving slots provided in the electrical component. The connector element 40 can be provided with one or more slotted grooves such as slotted grooves 44. The slotted grooves 44 provide an aligning means to ensure that the ground traces and signal traces are brought into electrical contact with the appropriate ground contacts and signal contacts, respectively, when the connector element is inserted into a receiving slot of an electrical component. It will be appreciated that other suitable aligning means, such as bumps located on the surface of the connector element 40 or projections extending from the connector element 40, can be used instead of the slotted grooves 44. It will be further appreciated that the signal traces and ground traces comprising signal traces 42 may be arranged so that no aligning means is necessary. The connector element 40 can also be provided with a layer 46 of electrically conductive material located on a portion of each face of the connector element 40. The electrically conductive layer 46 serves as a grounding shield to protect the connector element from the effects of RF interference.

Figure 2B:
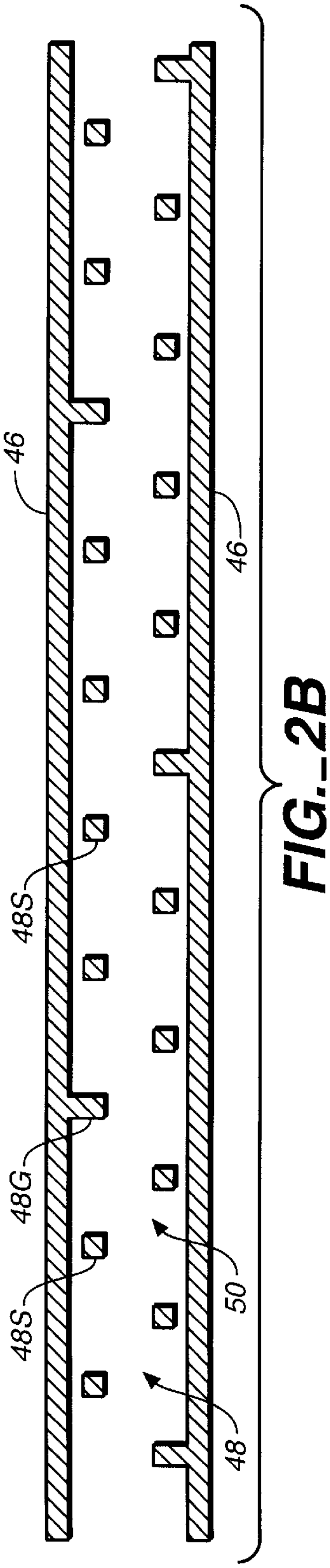

Referring now to FIG. 2B, a cross-sectional view of the connector element 40 is shown. The connector element 40 includes an inner layer 48 which contains electrically conductive signal leads 48G and 48S for appropriately conducting electrical signals between ground traces and between signal traces, respectively. Inner layer 48 is surrounded by a dielectric layer 50, on which the signal traces are printed on the edges of each surface of the dielectric layer 50. Signal leads 48G and 48S are appropriately connected between ground traces and signal traces, respectively, through dielectric layer 50. Conductive layers 46 are provided on portions of opposite surfaces of the connector element 40 as grounding RF shields. It will be appreciated that the connector element 40 is constructed so as to form a microstrip. It will be further appreciated that the dimensions of the dielectric layer 50 may be selected to ensure that the impedance of the connector element 40 matches the impedance of the driving circuits of the electrical components to be connected. By tuning the impedance of the connector element 40, signal reflection and degradation is significantly less than that in network hubs which use conventional cables. The arrangement of FIG. 1 and connector element of FIGS. 2A–B are described in more detail in applicant's related U.S. Pat. No. 5,645,434, which is incorporated herein by reference.

Figure 3:
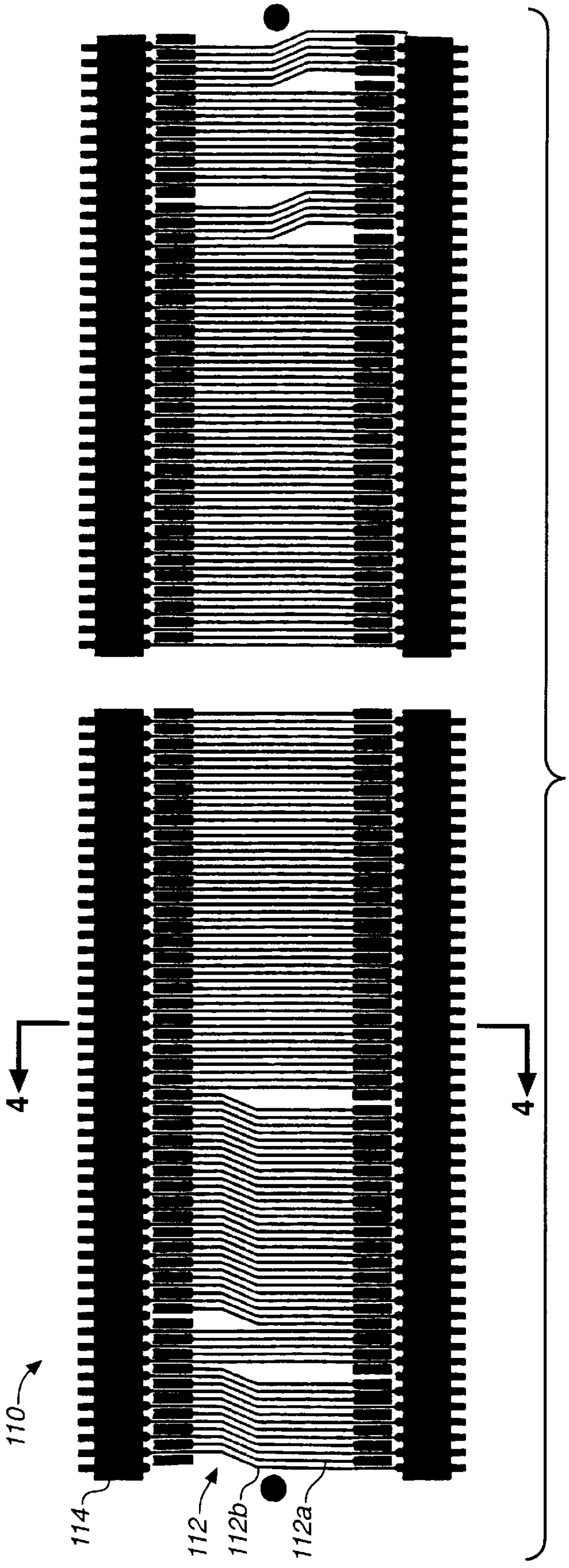
FIG. 3 is a diagram of an alternative embodiment of a connector element according to the present invention.

FIG. 3 shows an alternative embodiment for the connector device which accommodates faster signal speeds. This embodiment is preferably used to connect a switching hub, such as an Ethernet switch, as opposed to a repeater-type hub. To accommodate the increased signal speed associated with Ethernet switching hubs or similar devices, this embodiment includes a number of modifications to the previous embodiment. In the embodiment of FIG. 3, the connector device 110 includes signal lines 112 printed on the outer surface of the connector. By printing the signal lines on the surface of the connector device, faster signal speeds (as compared to the previous case where signal traces on the surface are connected by signal leads within the connector body) can be accommodated.

The connector in this example includes signal lines 112*a* and ground lines 112*b*. The signal lines 112*a* and ground lines 112*b* are preferably arranged in an alternating fashion, such that signal lines are typically situated between two ground lines, and vice versa. Further, the connector 110 includes relatively large ground planes 114 located along the horizontal edges of the connector 110. This arrangement allows the connector device 110 to be aligned more easily in the receiving slot(s) of the network hubs.

Figure 4:
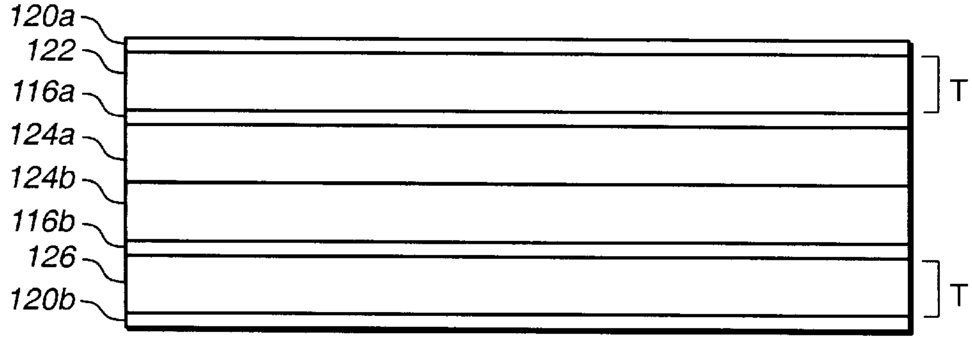
FIG. 4 is a cross-sectional diagram showing the layers of the embodiment of FIG. 3.

Referring now to FIG. 4, the layer arrangement of the connector device 110 of FIG. 3 is shown. According to a preferred embodiment of the invention, the connector device 110 includes an even number of layers in order to prevent warping of the connector device and to provide a relatively uniform distance between the central ground planes within the body of the connector element 110 and the signal lines 112 printed on the surface of the connector 110. This improves the impedance-matching of the connector device 110. As shown in FIG. 4, the connector 110 includes ground planes 116*a* and 116*b* within the body of the connector device 110. More specifically, the exemplary connector device 110 includes a signal line layer 120*a,* a dielectric layer 122 having a thickness T, a ground plane 116*a* preferably of copper, first and second insulation layers 124*a* and 124*b* of a dielectric material, a second ground plane 116*b* (also preferably of copper), a second dielectric layer 126 having a thickness substantially identical to the thickness T of the layer 122, and a signal line layer 120*b*. The thickness T is preferably chosen to match the impedance of the connector device 110 to the network hubs. In this example, an even number (4) of dielectric layers is used.

Together, the above-described modifications and improvements improve signal integrity and continuity, and allow a significantly faster signal speed to be accommodated. A connector device according to this embodiment of the present invention can be used to accommodate signal frequencies of at least approximately 66 MHZ, compared to 5 MHZ for the case where signal traces on the outer surfaces of the connector are connected by signal leads within the connector body.

While the foregoing description has included many details and specificities, it is to be understood that these are intended to illustrate the present invention and are not to be construed as limitations of the invention. Numerous modifications will be readily apparent to those of ordinary skill in the art without departing from the spirit and scope of the invention, as defined by the following claims and their legal equivalents.

What is claimed is:

1. A connector element for connecting network hubs, comprising:

a substantially planar connector body having first and second surfaces and one or more edges and comprising an electrically insulating material and an even number of layers, the connector body including at least one grounding plane layer contained within the electrically insulating material of the connector body and substantially electrically insulated from the first and second surfaces of the connector body by the electrically insulating material; and a plurality of electrically conducting signal lines printed on one or more surfaces of the connector body, the signal lines extending substantially across the connector body and including ground lines and information lines, wherein the connector element fits into receiving slots located on each of two network hubs, the receiving slots including signal contacts and ground contacts, such that the signal contacts and signal lines, and ground contacts and ground lines, are brought into electrical contact to form a substantially continuous signal bus, wherein the even number of layers operates to reduce warping and the effect of RF interference.

2. The connector element of claim 1, wherein the signal lines and ground lines are arranged in an alternating fashion on the one or more surfaces of the connector body.

3. The connector element of claim 1, wherein the layers include dielectric layers.

4. The connector element of claim 1, wherein the impedance of the signal lines is matched to the impedance of the network hubs.

5. The connector element of claim 1, wherein the network hubs are Ethernet switching devices.

6. The connector element of claim 1, further comprising ground connection plates arranged along one or more edges of the connector body.

7. The connector element of claim 1, wherein the connector body includes an aligning means to assist the alignment of the signal lines and ground lines with the signal contacts and ground contacts, respectively.

8. The connector element of claim 7, wherein the aligning means includes one or more slotted grooves which cooperate with elements inside the one or more receiving slots to assist the alignment.

9. The connector element of claim 1, wherein the substantially continuous signal bus accommodates signals greater than 5 MHz.

10. The connector element of claim 9, wherein the substantially continuous signal bus accommodates signals of at least approximately 66 MHz.

11. The connector element of claim 3, wherein the one or more ground planes are separated from the signal lines on different surfaces of the connector body by a substantially identical distance.

* * * * *